United States Patent
Pogge et al.

(10) Patent No.: US 7,354,798 B2
(45) Date of Patent: Apr. 8, 2008

(54) THREE-DIMENSIONAL DEVICE FABRICATION METHOD

(75) Inventors: H. Bernhard Pogge, Hopewell Junction, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 10/538,905

(22) PCT Filed: Dec. 20, 2002

(86) PCT No.: PCT/US02/41181

§ 371 (c)(1),
(2), (4) Date: Jun. 14, 2005

(87) PCT Pub. No.: WO2004/059720

PCT Pub. Date: Jul. 15, 2004

(65) Prior Publication Data

US 2006/0121690 A1    Jun. 8, 2006

(51) Int. Cl.
*H01L 21/46*    (2006.01)
*H01L 21/00*    (2006.01)
*H01L 21/4763*  (2006.01)

(52) U.S. Cl. ............... 438/109; 438/459; 438/977; 438/637; 438/672; 438/675; 257/E21.597

(58) Field of Classification Search ............ None
See application file for complete search history.

(56) References Cited

U.S. PATENT DOCUMENTS

| | | | |
|---|---|---|---|
| 4,889,832 A | | 12/1989 | Chatterjee |
| 4,897,708 A | * | 1/1990 | Clements ............... 257/690 |
| 4,954,875 A | * | 9/1990 | Clements ............... 257/686 |
| 5,091,331 A | | 2/1992 | Delgado et al. |
| 5,268,326 A | | 12/1993 | Lesk et al. |
| 5,419,806 A | * | 5/1995 | Huebner ............... 216/20 |

(Continued)

OTHER PUBLICATIONS

J.-Q. Lu et al., "Fabrication of via-chain test structures for 3D IC technology using dielectric glue bonding on 200 mm wafers," Materials Research Society ULSI XVII Conference Proceedings 151 (2002).

(Continued)

*Primary Examiner*—David E Graybill
(74) *Attorney, Agent, or Firm*—Lisa U. Jaklitsch

(57) ABSTRACT

A method is described for fabricating a three-dimensional integrated device including a plurality of vertically stacked and interconnected wafers. Wafers (1, 2, 3) are bonded together using bonding layers (26, 36) of thermoplastic material such as polyimide; electrical connections are realized by vias (12, 22) in the wafers connected to studs (27, 37). The studs connect to openings (13, 23) having a lateral dimension larger than that of the vias at the front surfaces of the wafers. Furthermore, the vias in the respective wafers need not extend vertically from the front surface to the back surface of the wafers. A conducting body (102) provided in the wafer beneath the device region and extending laterally, may connect the via with the matallized opening (103) in the back surface. Accordingly, the conducting path through the wafer may be led underneath the devices thereof. Additional connections may be made between openings (113) and studs (127) to form vertical heat conduction pathways between the wafers.

13 Claims, 22 Drawing Sheets

U.S. PATENT DOCUMENTS

| | | | |
|---|---|---|---|
| 5,608,264 A * | 3/1997 | Gaul | 257/734 |
| 5,618,752 A * | 4/1997 | Gaul | 438/626 |
| 5,627,106 A | 5/1997 | Hsu | |
| 5,646,067 A * | 7/1997 | Gaul | 438/458 |
| 5,668,409 A * | 9/1997 | Gaul | 257/723 |
| 5,682,062 A * | 10/1997 | Gaul | 257/686 |
| 5,767,001 A * | 6/1998 | Bertagnolli et al. | 438/455 |
| 5,770,884 A * | 6/1998 | Pogge et al. | 257/506 |
| 5,814,889 A * | 9/1998 | Gaul | 257/773 |
| 5,866,443 A * | 2/1999 | Pogge et al. | 438/110 |
| 6,444,560 B1 | 9/2002 | Pogge et al. | |
| 6,489,217 B1 | 12/2002 | Kalnitsky et al. | |
| 6,577,013 B1 * | 6/2003 | Glenn et al. | 257/777 |
| 6,583,030 B1 * | 6/2003 | Grassl | 438/459 |
| 6,599,778 B2 * | 7/2003 | Pogge et al. | 438/118 |
| 6,608,371 B2 * | 8/2003 | Kurashima et al. | 257/686 |
| 6,642,081 B1 * | 11/2003 | Patti | 438/109 |
| 6,693,361 B1 * | 2/2004 | Siniaguine et al. | 257/777 |
| 6,737,297 B2 * | 5/2004 | Pogge et al. | 438/107 |
| 6,809,421 B1 * | 10/2004 | Hayasaka et al. | 257/777 |
| 6,835,589 B2 * | 12/2004 | Pogge et al. | 438/52 |
| 2002/0074637 A1 * | 6/2002 | McFarland | 257/686 |

OTHER PUBLICATIONS

P. Ramm et al., "Interchip via technology by using copper for vertical system integration," Materials Research Society Advanced Metallization Conference 159 (2002).

Rahman et al., "Thermal analysis of three dimensional integrated circuits," IEEE International Interconnect Technology Conference Proceedings 157 (2001).

* cited by examiner

THREE-DIMENSIONAL DEVICE FABRICATION METHOD

FIELD OF THE INVENTION

This invention relates to the manufacture of very large-scale integrated semiconductor devices, and more particularly to methods for fabricating three-dimensional, vertically interconnected chips.

BACKGROUND OF THE INVENTION

Microprocessor chips generally include a logic unit and cache memory. If both the logic unit and the memory devices of a microprocessor are arranged in a two-dimensional (2-D) pattern, limitations on the physical size of the chip (imposed by poor process yields for large-area chips) may lead to restrictions on the amount of cache memory. The performance of the microprocessor may therefore be severely limited.

To address the problem of providing adequate cache memory for microprocessors (and more generally the problem of 2-D real estate on a chip), a number of researchers are exploring methods for building three-dimensional (3-D) integrated circuits. A typical 3-D fabrication process includes building devices on wafers which are then thinned to less than 20 μm; providing vertical interconnections through the wafers; stacking the wafers so that vertical connections are established between wafers at different levels; and bonding the wafers with a suitable material. See, for example, J.-Q. Lu et al., "Fabrication of via-chain test structures for 3D IC technology using dielectric glue bonding on 200 mm wafers," Materials Research Society ULSI XVII Conference Proceedings 151 (2002); P. Ramm et al., "Interchip via technology by using copper for vertical system integration," Materials Research Society Advanced Metallization Conference 159 (2002); and Rahman et al., "Thermal analysis of three-dimensional integrated circuits," IEEE International Interconnect Technology Conference Proceedings 157 (2001). Significant problems in the present state of the art of 3-D integration include (1) the need for reliable wafer bonding; (2) stringent wafer cleanliness and flatness requirements; (3) the need for reliable, low-resistance inter-wafer vertical connections; (4) stringent wafer-to-wafer lateral registration requirements; and (5) the need for efficient heat conduction through the 3-D device.

A process for making 2-D chip-to-chip interconnects is described in "Process for making fine pitch connections between devices and structure made by the process," U.S. Pat. No. 6,444,560 assigned to International Business Machines Corporation, the disclosure of which is incorporated herein by reference. As noted in this patent, chips having different functions and possibly of different materials may be connected through a wiring layer of polyimide using stud/via connections between the wiring layer and the respective chips. It is desirable to extend the techniques discussed in this patent to achieve 3-D chip-level and wafer-level integration.

SUMMARY OF THE INVENTION

The present invention addresses the above-described concerns by providing a method for fabricating a three-dimensional integrated device including a plurality of vertically stacked and interconnected wafers, in which the wafers may be reliably bonded together and the requirements for wafer flatness and highly precise alignment between wafers may be relaxed. In order to vertically connect a first wafer and a second wafer, a via is formed in the first wafer extending from the front surface, the via being characterized by a lateral dimension at the front surface. Material is removed from the first wafer at the back surface thereof, thinning the wafer to less than 20 μm. An opening is formed in the back surface of the first wafer, thereby exposing the via; the opening has a lateral dimension greater than that of the via. A layer of conducting material is formed in this opening. A stud and a layer of bonding material are formed on the front surface of the second wafer, the studs projecting vertically therefrom. The stud is then aligned to the opening in the back surface of the first wafer; the wafers are bonded using the layer of bonding material, so that the stud makes electrical contact with the via. In order to interconnect three wafers, the second wafer is further provided with a via extending from the front surface of the wafer, and the second wafer is thinned by removing material from the second wafer at the back surface thereof. An opening is formed in the back surface of the second wafer, thereby exposing the via therein; this opening has a lateral dimension greater than the lateral dimension of the via. A layer of conducting material is formed in this opening. The third wafer has a layer of bonding material and a stud formed on the front surface thereof; the stud is aligned to the opening in the back surface of the second wafer. The third wafer is then bonded to the second wafer using the layer of bonding material, so that the stud of the third wafer makes electrical contact with the via of the second wafer, with the stud of the second wafer, and with the via of the first wafer.

According to the present invention, the vias in the respective wafers need not extend vertically from the front surface to the back surface of the wafers. A conducting body, provided in the wafer beneath the device region and extending laterally, may connect the via with the metallized opening in the back surface. Accordingly, the conducting path through the wafer may be led underneath the devices thereof. The bonding layer is preferably a thermoplastic material, and in particular may be polyimide. This permits wafers to be bonded with less stringent requirements regarding flatness and cleanliness.

Additional openings may be formed in the back surface of the first wafer, to connect to additional studs on the front surface of the second wafer, where the additional openings and studs are insulated from the vias. These additional connections serve as vertical heat conduction pathways between the wafers. The present invention therefore realizes 3-D vertical integration with both reliable electrical connections and improved heat conduction between wafers.

DETAILED DESCRIPTION OF PREFERRED EMBODIMENTS OF THE INVENTION

In accordance with the present invention, a plurality of thinned wafers with devices formed thereon may be stacked and vertically interconnected. In the embodiments described herein, a three-level stack is fabricated and connected; it will be appreciated that this is for illustration purposes only, and that the process may be adapted to more or fewer than three levels. The 3-D, vertically integrated device may be constructed in two ways, as detailed below.

(1) Top-down Wafer Stack Process

Figure 1A:
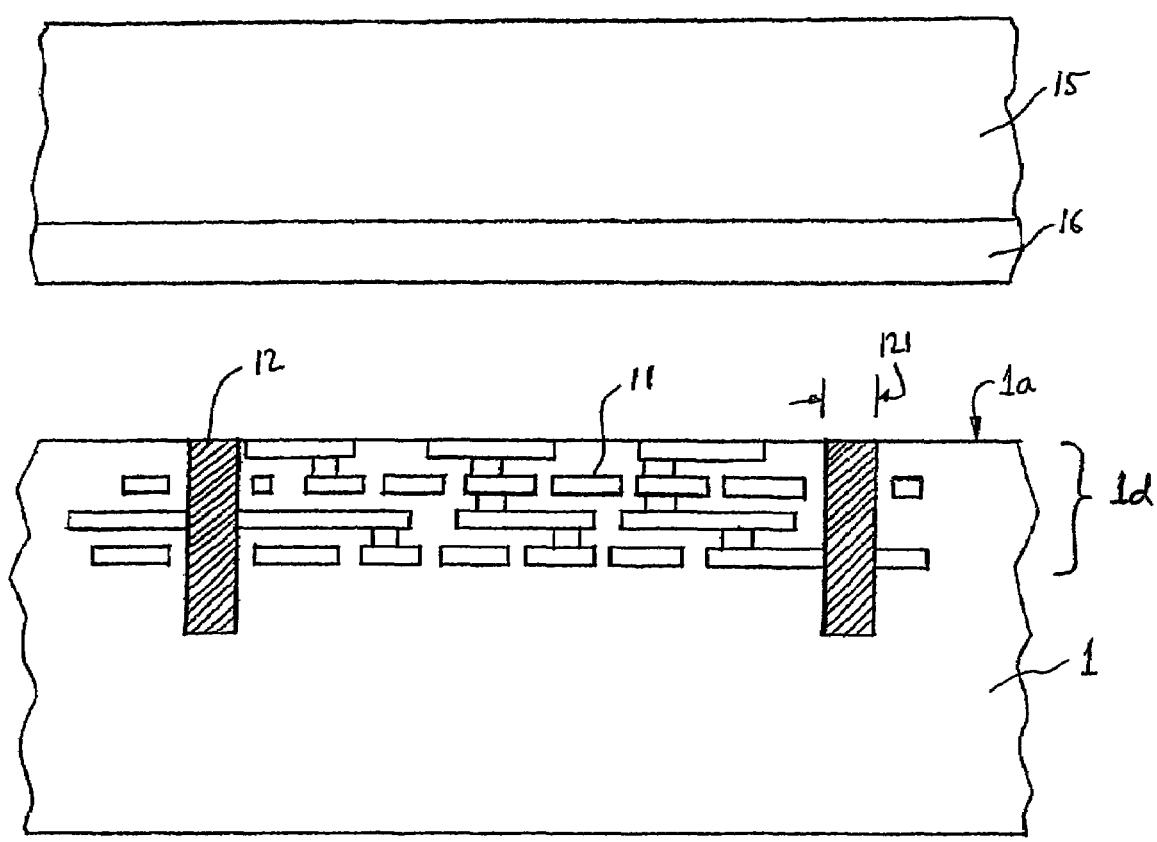
FIGS. 1A-1I are schematic illustrations of steps in a fabrication process for a 3-D integrated device, in accordance with a first embodiment of the invention.

FIG. 1A shows in cross-section a wafer 1 having devices and several levels of high-density interconnection wiring 11 (typically Cu) in a region 1d of the wafer near the front surface 1a thereof Metallized vias 12 are formed in the wafer, extending below the region 1d of devices and lateral interconnects; these vias will become part of the vertical through-connections after wafer 1 is thinned. Vias 12 are typically formed by etching holes in wafer 1, forming a layer of liner material on the sides and bottom of the holes, and filling the holes with metal (preferably copper). The depth of the vias 12 is less than the eventual thickness of wafer 1 after thinning; thus, if the wafer after thinning is about 10 µm thick, the vias are less than 10 µm deep. The diameter of the vias 121 must be chosen to balance heat conduction and space concerns. A diameter of approximately 1 µm consumes minimal space on the wafer surface while providing acceptable heat conduction through the wafer; a smaller via diameter may be used but may not be adequate for conducting heat through the vertical wafer stack.

For convenience of illustration, via 12 is shown extending straight downward with a uniform diameter into a region of the wafer below that of the devices. Size requirements for the vias may in practice be substantially relaxed below region 1d. Other arrangements are possible which involve the through-connections extending laterally underneath the devices, as discussed in more detail below.

In order to facilitate handling of the thinned wafer, a handling plate (typically of glass) 15 is attached to the front surface 1a of the wafer. The wafer 1 and plate 15 are bonded together using a layer 16 of a thermoplastic bonding material, preferably polyimide.

Figure 1B:
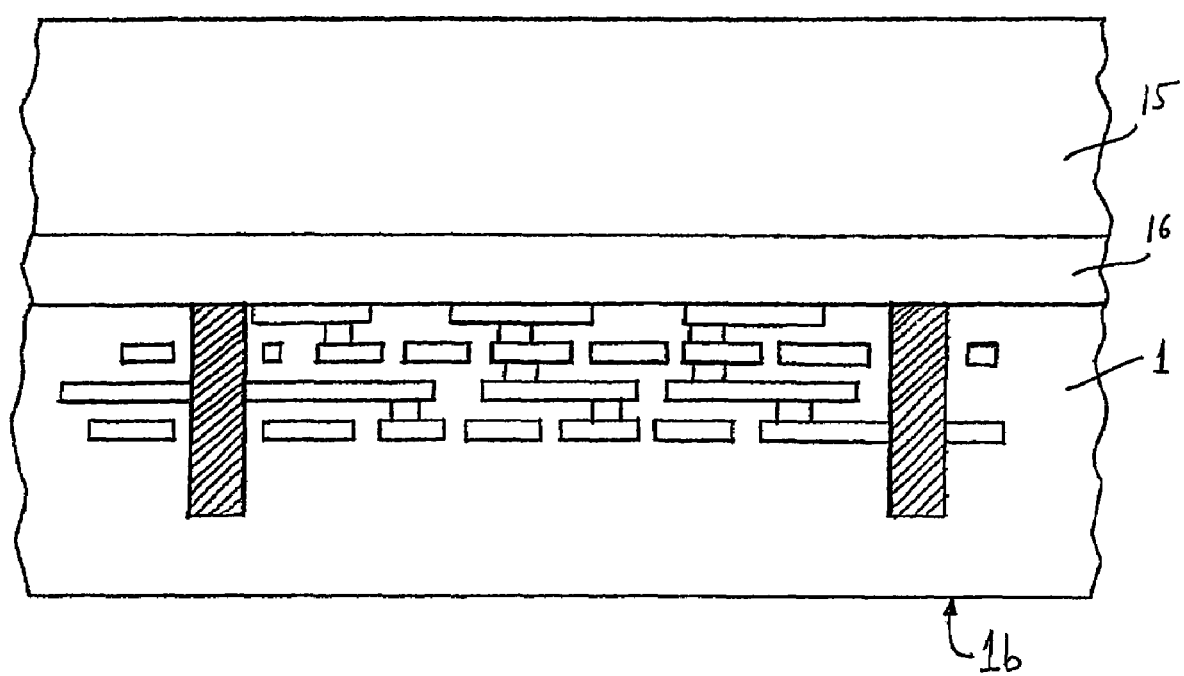

With the handling plate 15 attached to the wafer 1, the wafer is thinned by grinding or polishing the back side 1b (see FIG. 1B). The resulting thickness of wafer 1 is less than 20 µm, preferably about 10 µm. As shown in FIG. 1B, the thinning process stops short of exposing the bottom of vias 12.

Figure 1C:
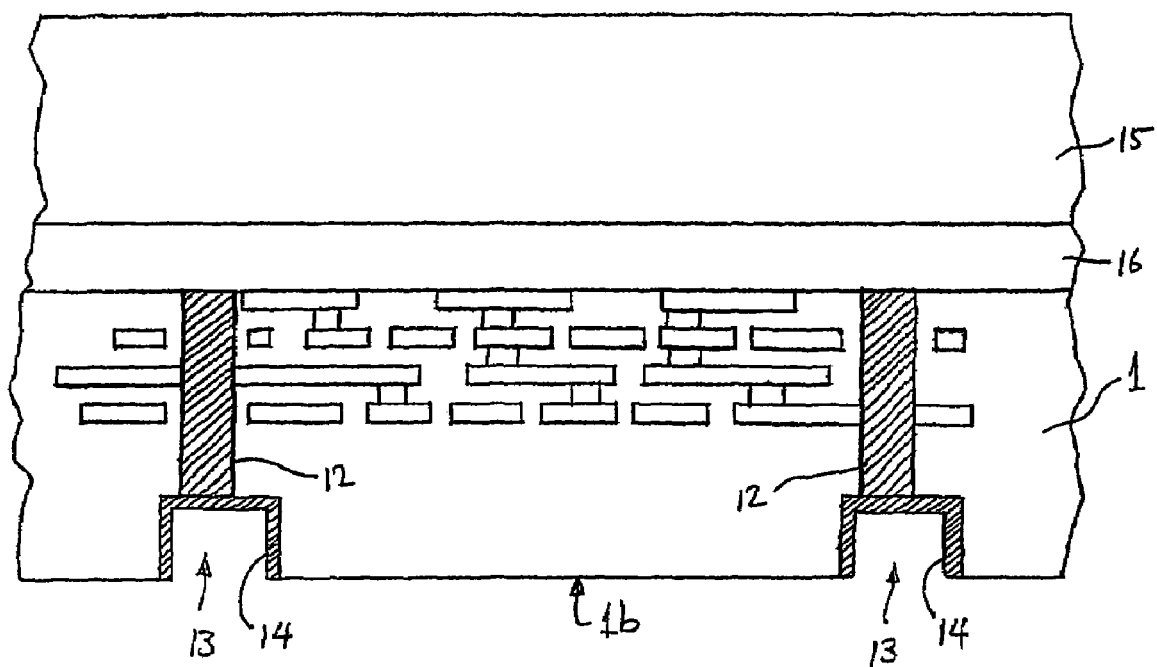

Openings 13 are then etched in the back surface 1b of the wafer, exposing the bottom of vias 12 (FIG. 1C). The metal in the via may itself serve as an etch stop for this process; alternatively, an etch stop layer may be provided at another portion of the wafer (not populated by devices) to provide control for this process. It should be noted that openings 13 have a greater diameter than that of vias 12. Although numerous arrangements of vias are possible (as discussed further below), the openings at the back surface 1b are generally larger than the vias at the front surface 1a.

The interior surfaces 14 of opening 13 are then coated with metal (preferably by sputtering) to make contact with the bottom end of the corresponding via 12, so that a conducting path is formed through wafer 1. It should be noted that opening 13 has a diameter greater (typically two times greater) than that of the corresponding via 12; this is to facilitate vertical connection with another wafer.

Figure 1D:
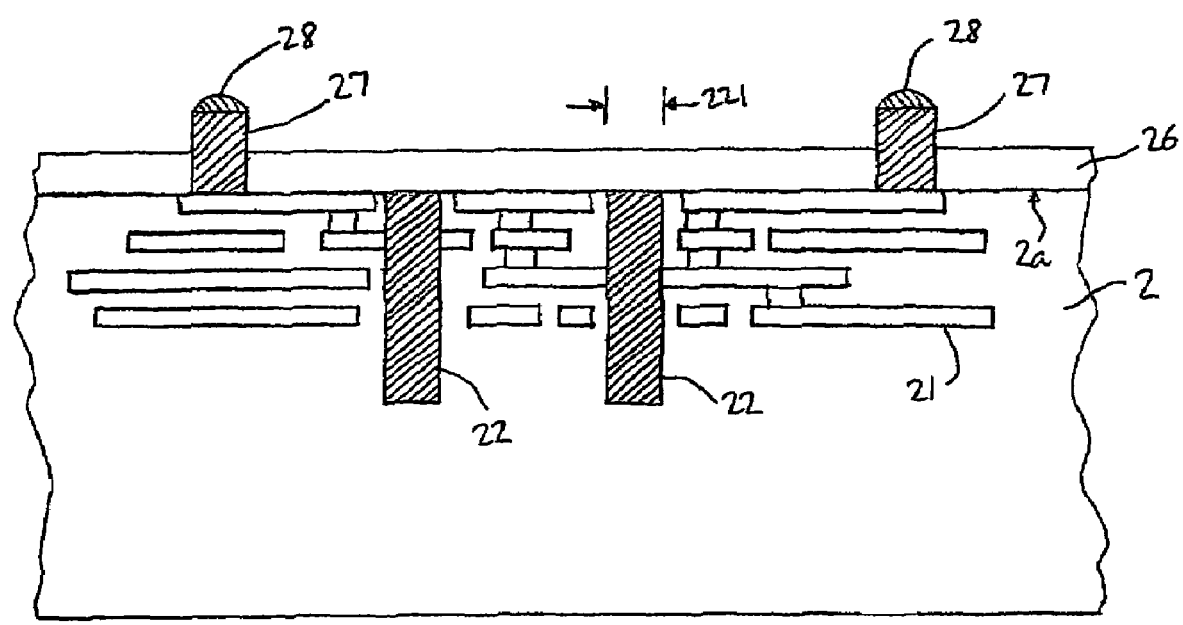

FIG. 1D shows a second wafer 2 which is to be vertically integrated with wafer 1. Wafer 2 has devices and interconnect wiring 21 formed thereon, similar to wafer 1. In addition, metallized vias 22 (typically filled with copper) extend downward into wafer 2; vias 22 have a lateral dimension 221 at surface 2a. A layer of polyimide 26 is deposited on the front surface 2a of wafer 2. Studs 27 are formed on surface 2a, extending above the top surface of layer 26 a distance which typically is 5 µm or less. Studs 27 may be formed of Ni, Cu, Ni-plated Cu, W or some other metal or combination of metals. A layer 28 of low-melting-point alloy material is deposited on the surface of the stud; this facilitates formation of an electrical connection during the process of vertically joining wafers 1 and 2. The alloy material is typically 90/10 Pb/Sn solder, 2 µm or less thick; alternative alloy materials include Au/Sn and Sn/Ag. The alloy material may be subjected to a thermal reflow process so that layer 28 acquires a rounded shape, as shown in FIG. 1D; this facilitates alignment of the studs on wafer 2 to corresponding openings in wafer 1. The studs extend electrical connections vertically upward from the devices of wafer 2, while the vias 22 extend electrical connections vertically downward.

Figure 1E:
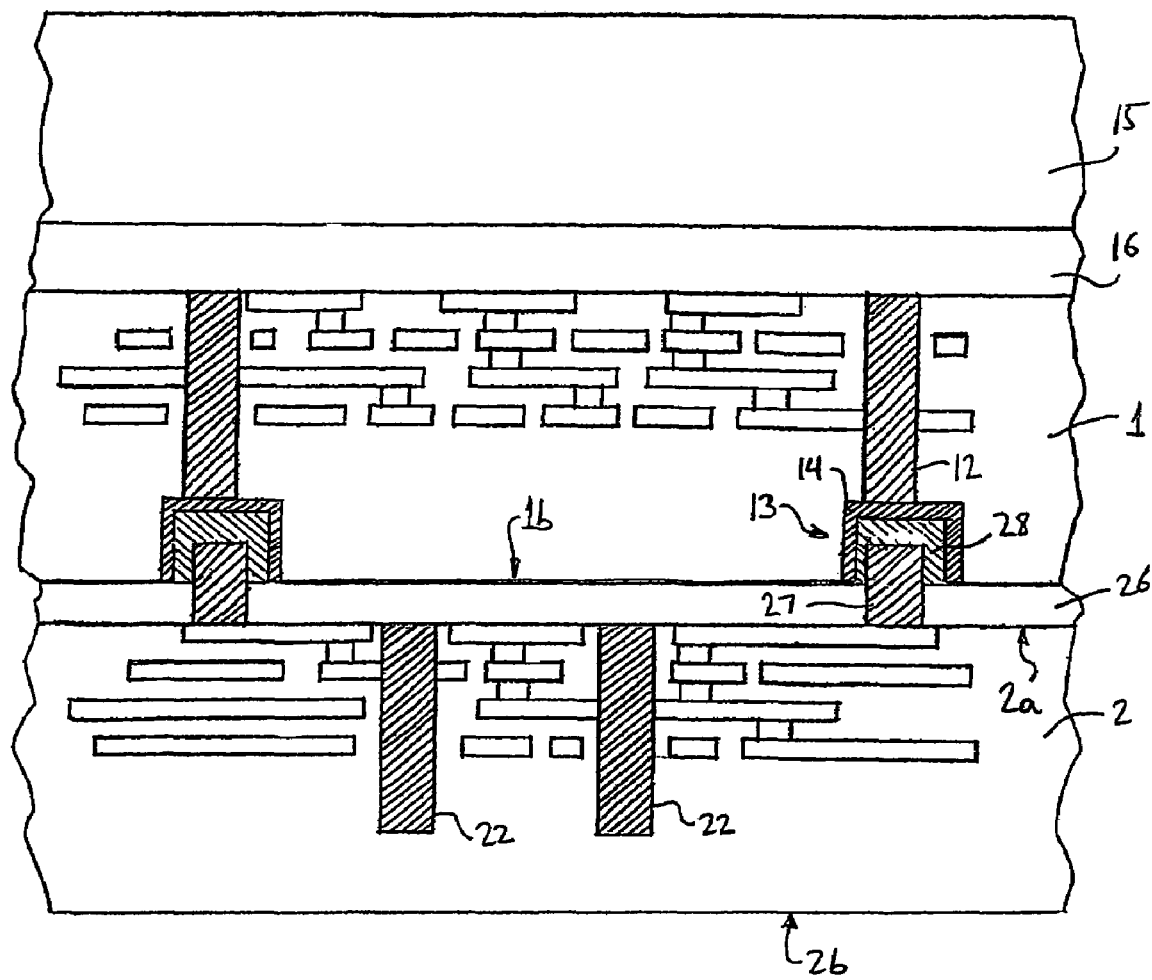

Wafer 1 (attached to handling plate 15) is then attached to wafer 2 using a bonding and lamination process. As shown in FIG. 1E, studs 27 on wafer 2 are brought into registration with openings 13 on wafer 1, with the back surface 1b of wafer 1 in contact with the front surface of polyimide layer 26. The lamination process is performed at a temperature and pressure sufficient to (1) ensure bonding between wafer 1 and layer 26 and (2) ensure electrical contact between stud 27 and metal 14 (and thence to via 12). Depending on the materials used, the temperature may be in the range 200° C.-400° C. and the pressure may be in the range 10 psi-200 psi. As shown in FIG. 1E, the bonding and lamination process causes the solder 28 to flow so that solder either partially or completely fills opening 13.

It should be noted that the openings 13 have a greater diameter than the studs 27, and are thus able to accommodate imprecision in the lateral placement of wafer 2 relative to wafer 1. Furthermore, it should be noted that surfaces 1b and 2a are not directly in contact, but have layer 26 between them. Polyimide layer 26 has sufficient thickness to cover small surface particles, fill in minor surface defects, or accommodate differences in flatness of the two wafers. Accordingly, layer 26 plays an important role in ensuring a reliable mechanical bond between the wafers, while the stud/via connection 27-28-14-12 provides a reliable vertical electrical connection.

Figure 1F:
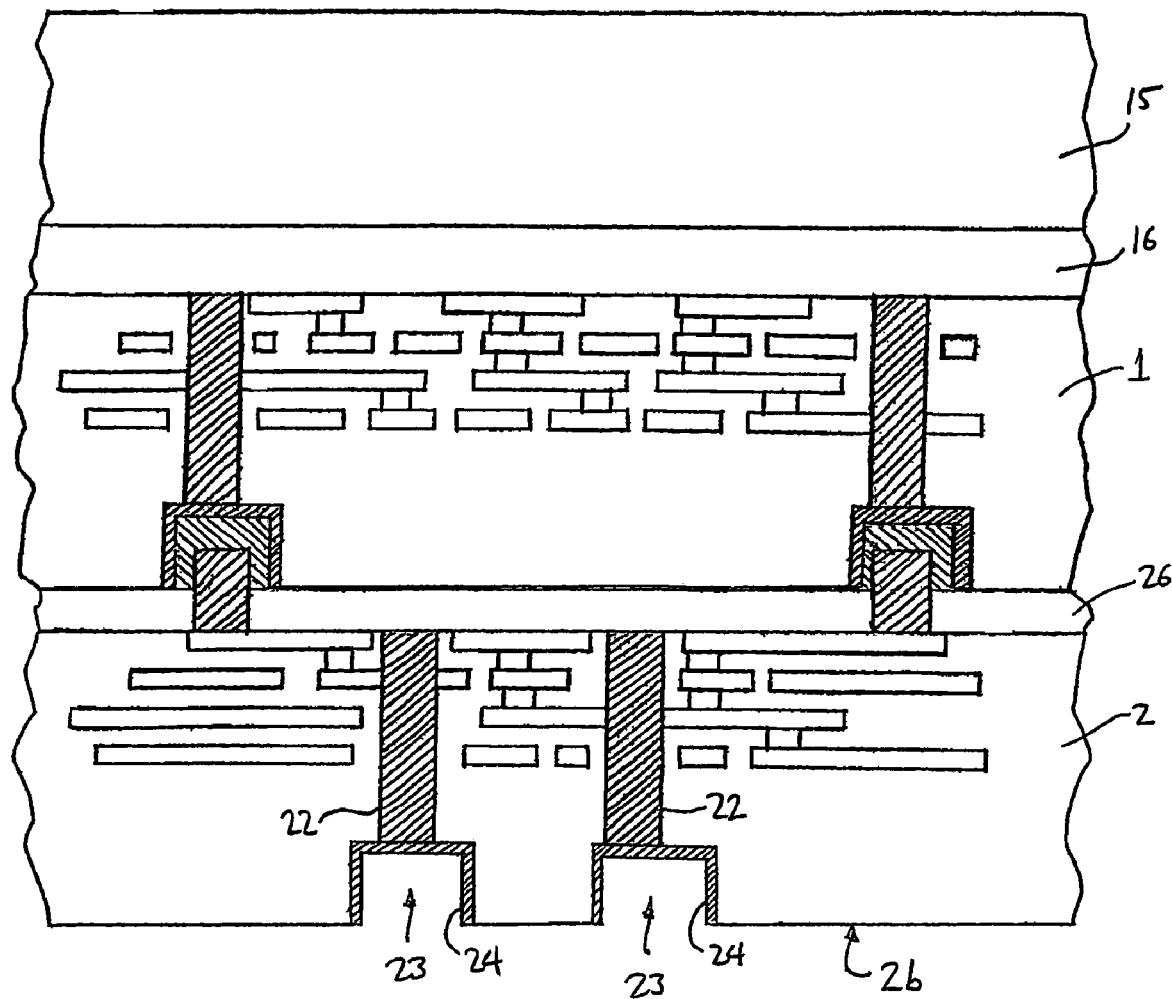

Wafer 2 (now bonded to wafer 1) is then thinned to less than 20 µm, preferably about 10 µm. As shown in FIG. 1F, openings 23 are formed in the back surface 2b of wafer 2, exposing the bottom of vias 22. The interior surfaces of openings 23 are coated with metal 24 (preferably by sputtering as with wafer 1), to provide electrical connection to another wafer 3.

Figure 1G:
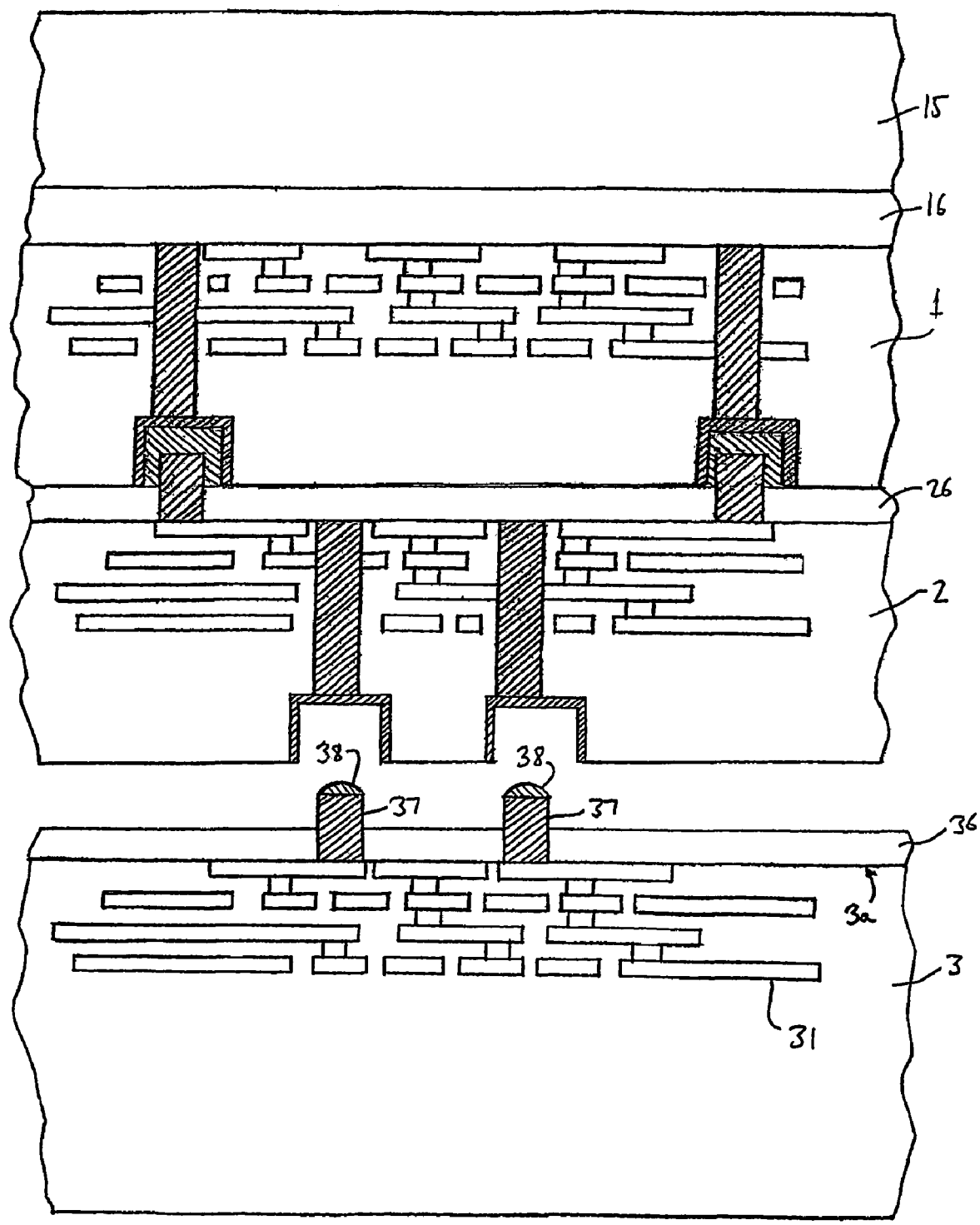

FIG. 1G illustrates preparation of wafer 3 for bonding to wafers 1 and 2. Wafer 3 also has devices and interconnection wiring 31 near the front surface thereof. In order to make electrical contact with the back side of wafer 2, studs 37 are formed on the front side 3a of wafer 3. Studs 37 have an alloy material 38 on the surface thereof, similar to studs 27 and alloy material 28 respectively on wafer 2. A polyimide layer 36 is also deposited on surface 3a, similar to layer 26. In this illustration, wafer 3 is the final wafer of the vertical stack to be bonded, accordingly, wafer 3 is not thinned (in order to provide mechanical strength for the stack) and does not require through-wafer vias.

Figure 1H:
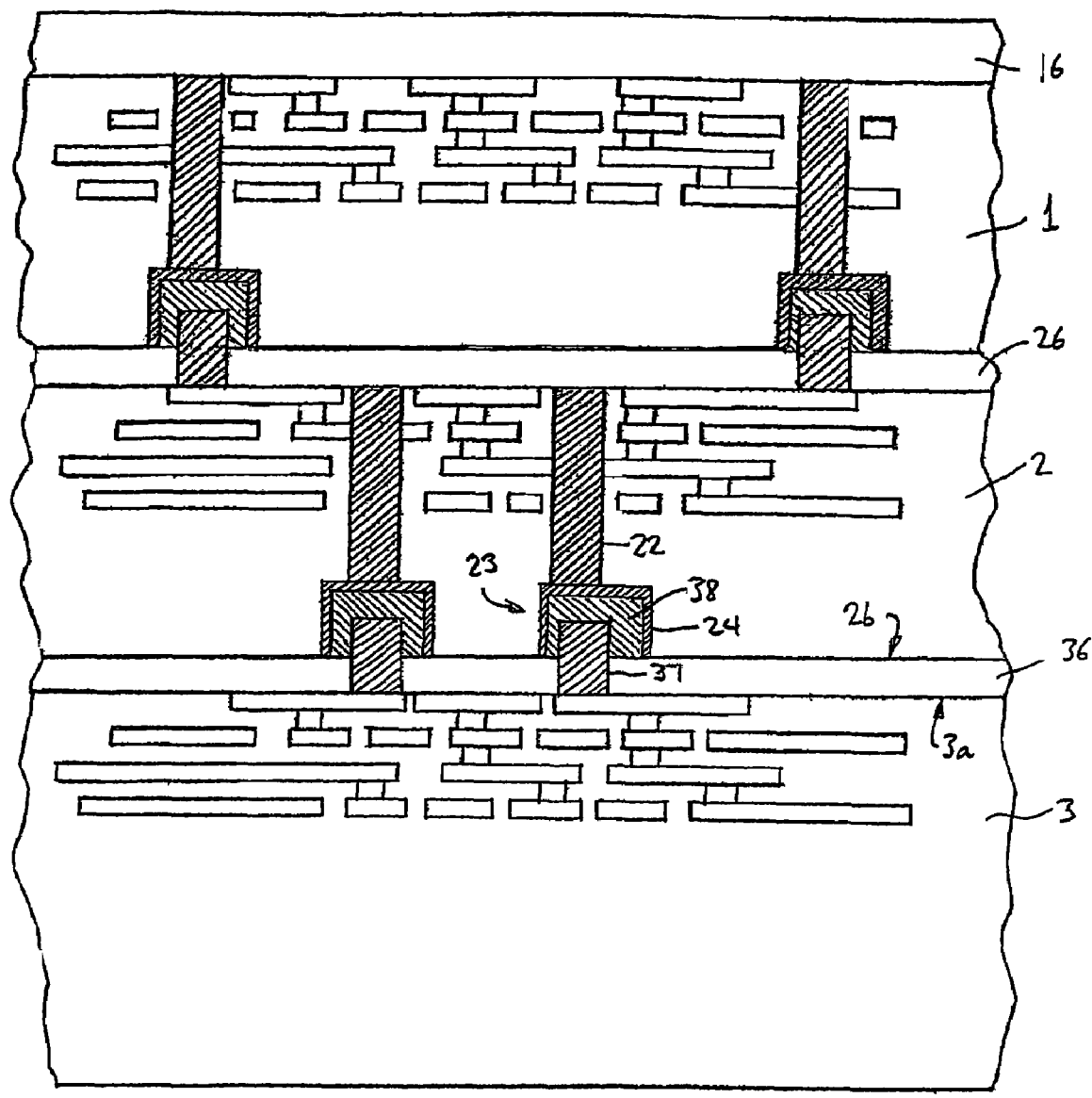

FIG. 1H shows the result of the bonding and lamination process for wafer 3. Studs 37 are brought into electrical contact with via 22, as a result of alloy material 38 filling opening 23 and bonding to metal layer 24. Polyimide layer 36 is bonded to surface 2b of wafer 2, similarly to layer 26 between wafers 1 and 2. Since the unthinned wafer 3 provides mechanical strength to thinned wafers 1 and 2, the handling plate 15 is no longer required and may be removed at this point. This may conveniently be done by laser ablation; that is, if plate 15 is transparent to ablating radiation, a laser may be used to ablate the interface between plate 15 and layer 16, thereby detaching the plate.

Figure 1I:
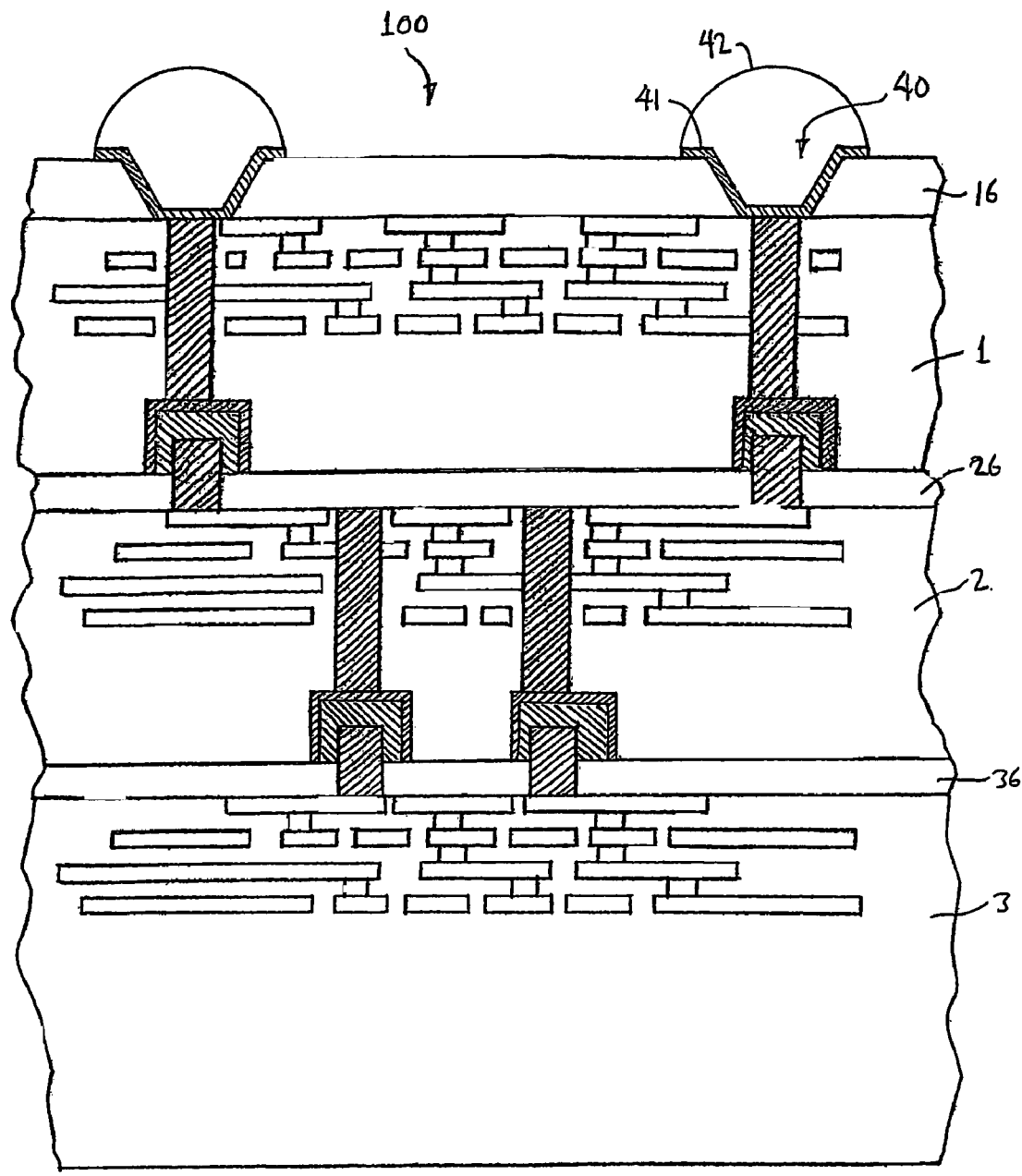

The vertically interconnected wafer stack 1-2-3 may then have external connections attached, as shown in FIG. 1I. FIG. 1I shows, for example, C4 technology used to connect the vertical stack to other components in a larger device. Openings 40 are formed in layer 16 to expose the metallized vias 12 of wafer 1; metal pads 41 are then deposited in the openings. C4 solder bumps 42 are then formed on these pads, using (for example) solder mask techniques known in the art. The completed vertically integrated device 100 is then ready to be bonded to C4 pads on a multichip module (MCM) or the like.

It should be noted that the internal structure of wafers 1, 2 and 3 has been illustrated only schematically; in fact, these wafers may be fabricated by a variety of methods and may have different functions. For example, all three wafers may have cache memory devices; wafers 1 and 2 may have memory while wafer 3 has logic devices; one or more of the wafers may incorporate micro-electromechanical systems (MEMS); and so forth.

The present inventors have found that successful wafer-level vertical integration is ensured by (1) thinning wafers to about 10 μ, to minimize vertical heat-transfer problems in the vias; (2) using polyimide as a thermoplastic bonding material, to relax wafer flatness and cleanliness requirements; and (3) using stud/via connections where the backside via opening is substantially larger than the stud, to relax lateral registration requirements.

(2) Bottom-up wafer stack process

An alternative process for bonding wafers in a vertical stack is illustrated in FIGS. 2A-2E; this process will be detailed for three wafers but, as noted above, may be adapted to more or fewer wafers. A wafer 1 is first prepared in accordance with the process shown in FIGS. 1A-1C; this wafer thus is thinned to about 10 μm, has metallized vias 12 with openings 13 on the back surface, and has a handling plate 15 attached to the front surface with a polyimide layer 16.

Figure 2A:
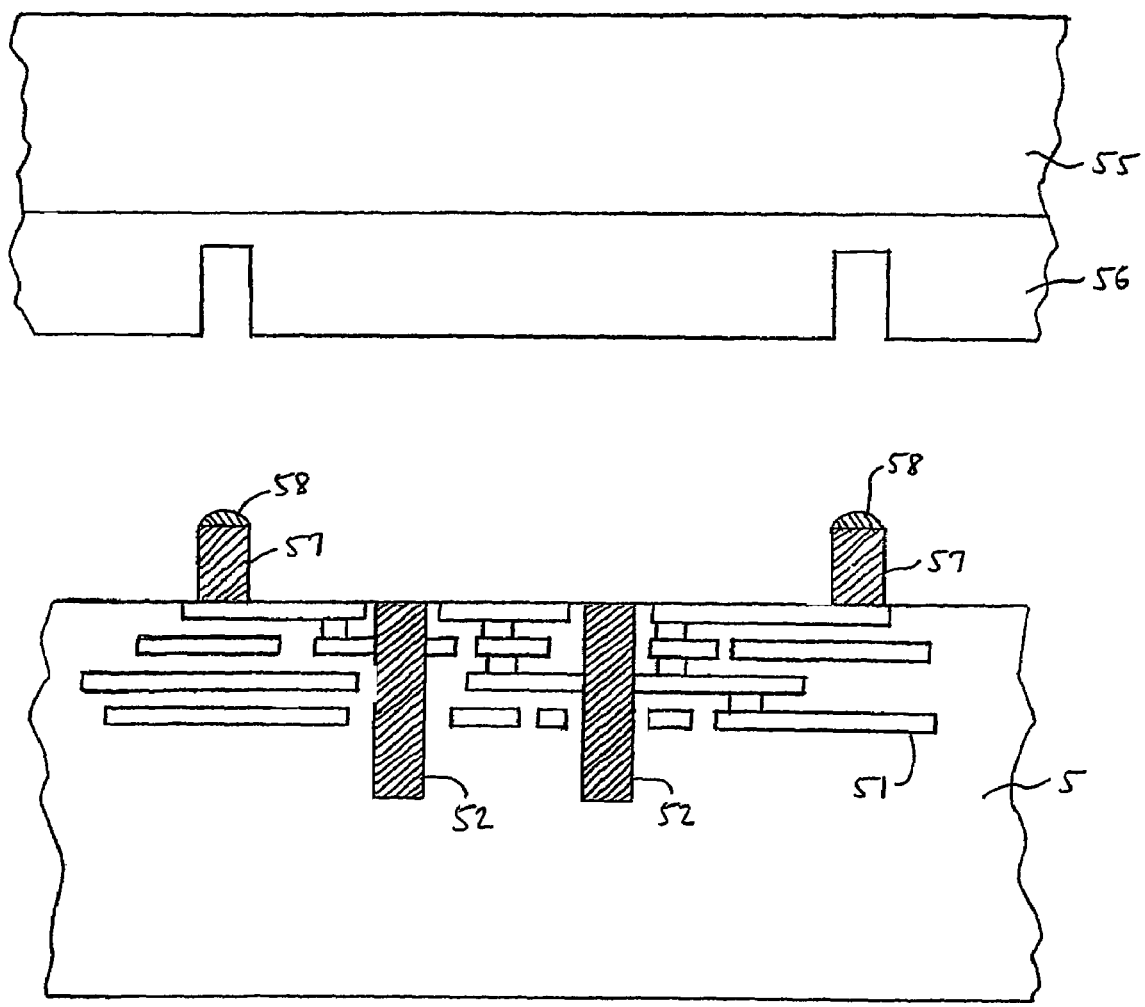
FIGS. 2A-2F are schematic illustrations of steps in a fabrication process for a 3-D integrated device, in accordance with a second embodiment of the invention.
Figure 2B:
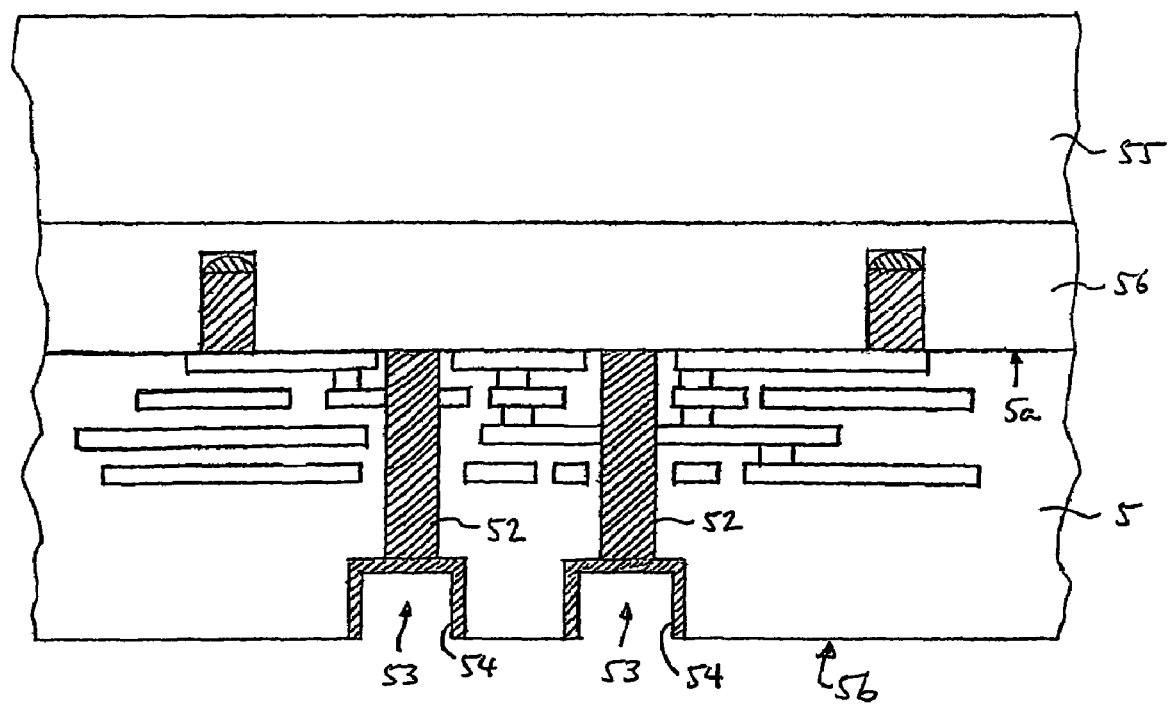

A second wafer 5, having lateral interconnect wiring 51, is then prepared as shown in FIG. 2A. Wafer 5 has both vias 52 and studs 57 with alloy material 58, similar to wafer 2 in the process described above (compare FIG. 1D). A handling plate 55 is provided for wafer 5; plate 55 is covered with a polyimide coating 56 which is patterned to accommodate studs 57. Wafer 5 is then bonded to handling plate 55, which permits the wafer to be thinned (FIG. 2B). Openings 53 are formed in the backside 5b of the thinned wafer, and the interior surfaces thereof are coated with a metal layer 54 as described previously.

Since wafers 1 and 5 each have respective handling plates 15 and 55, they may be prepared, bonded and thinned separately.

Figure 2C:
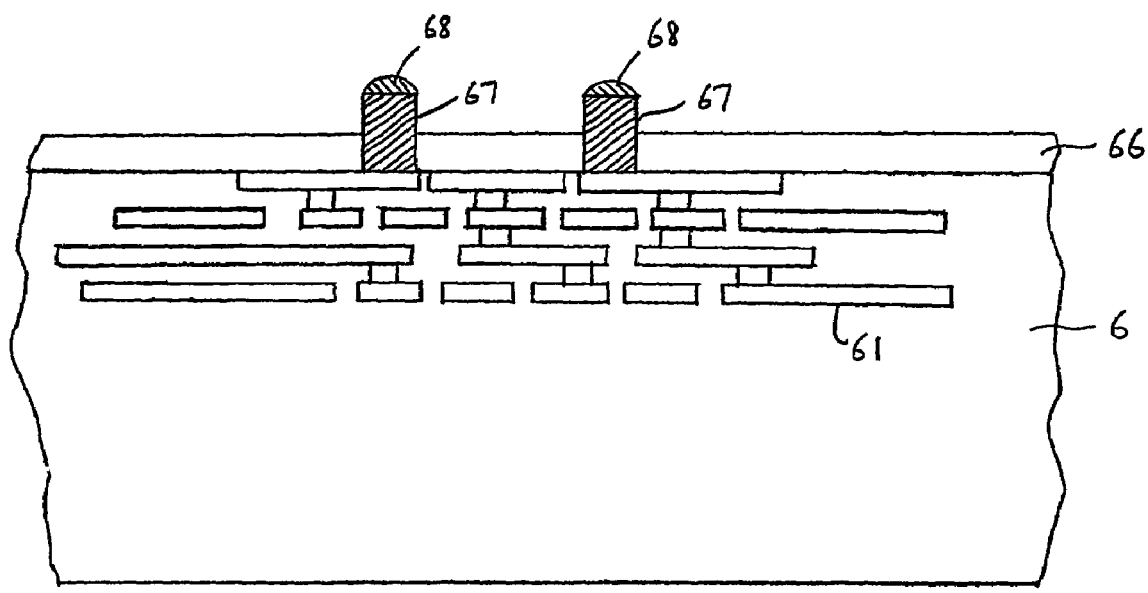
Figure 2D:
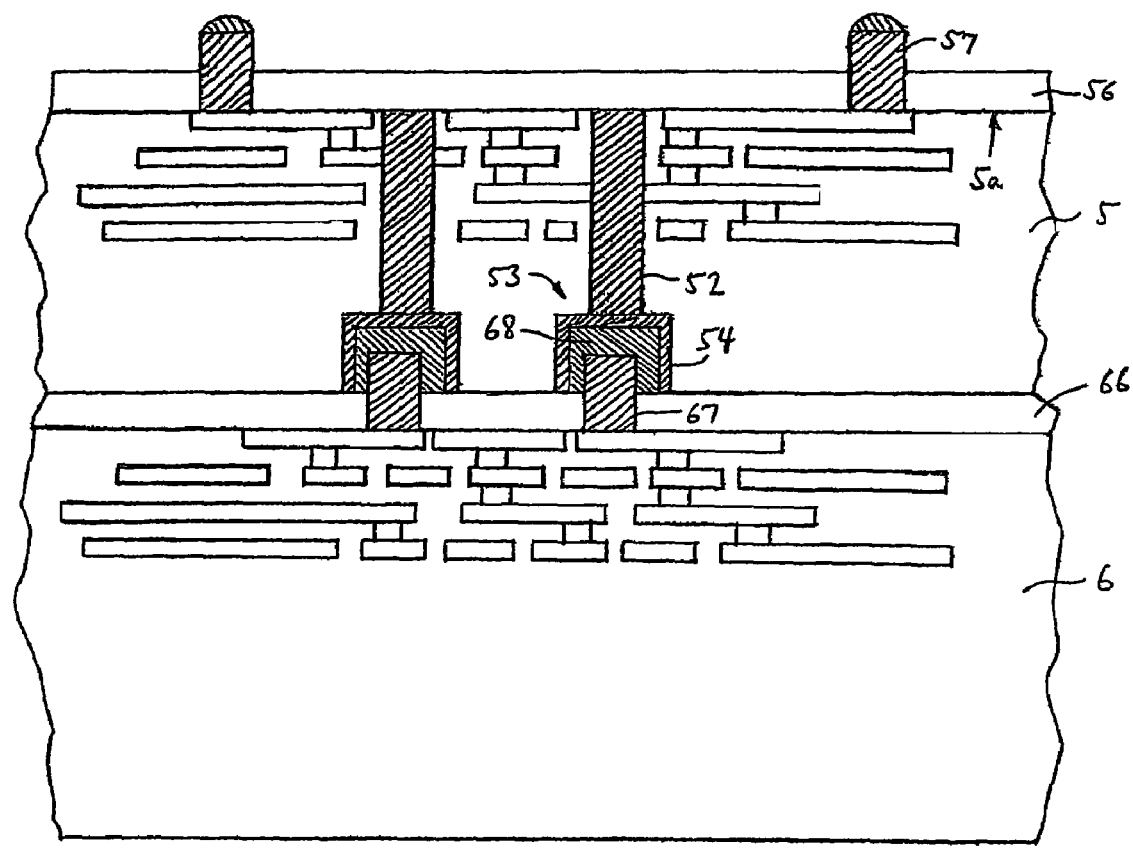
Figure 2E:
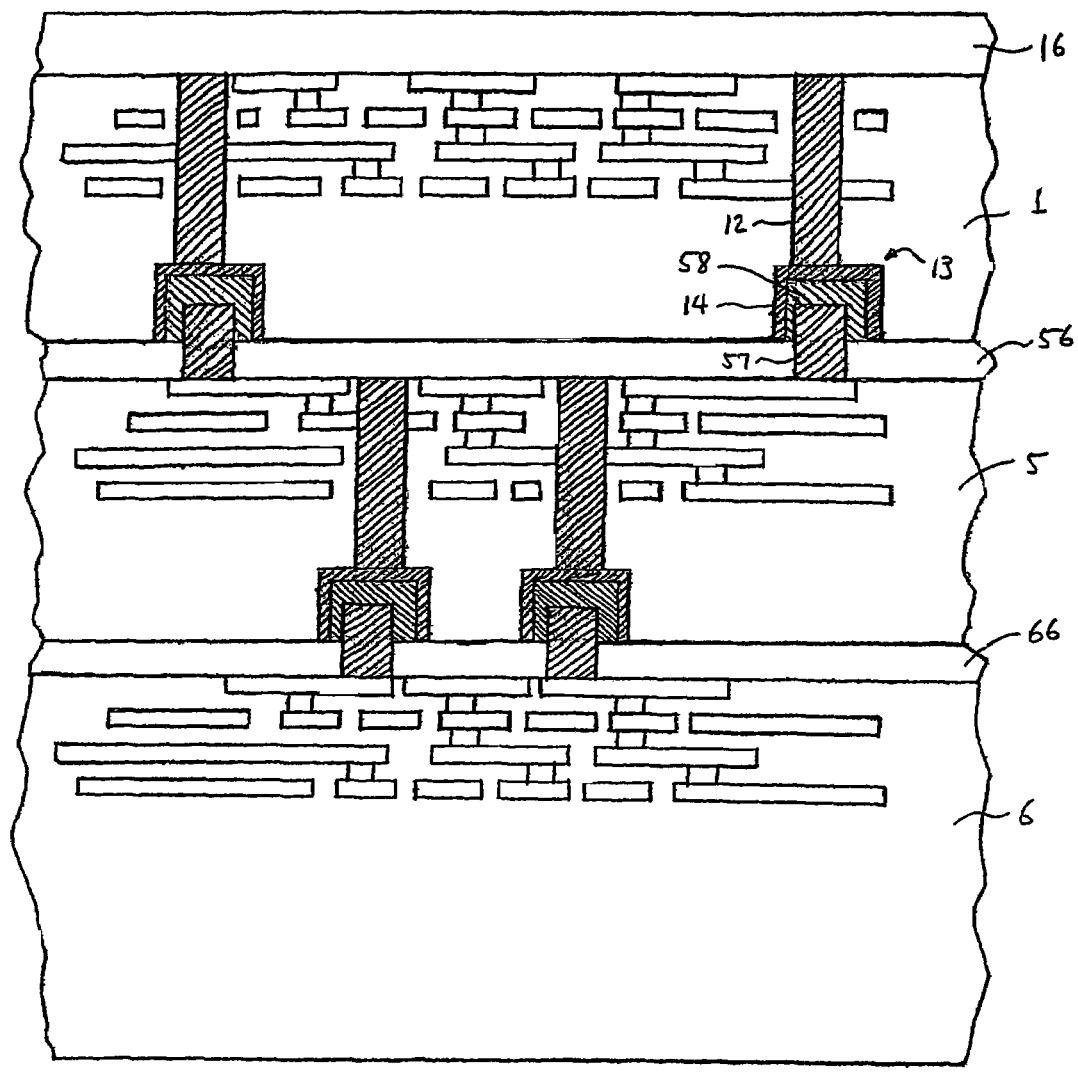
Figure 2F:
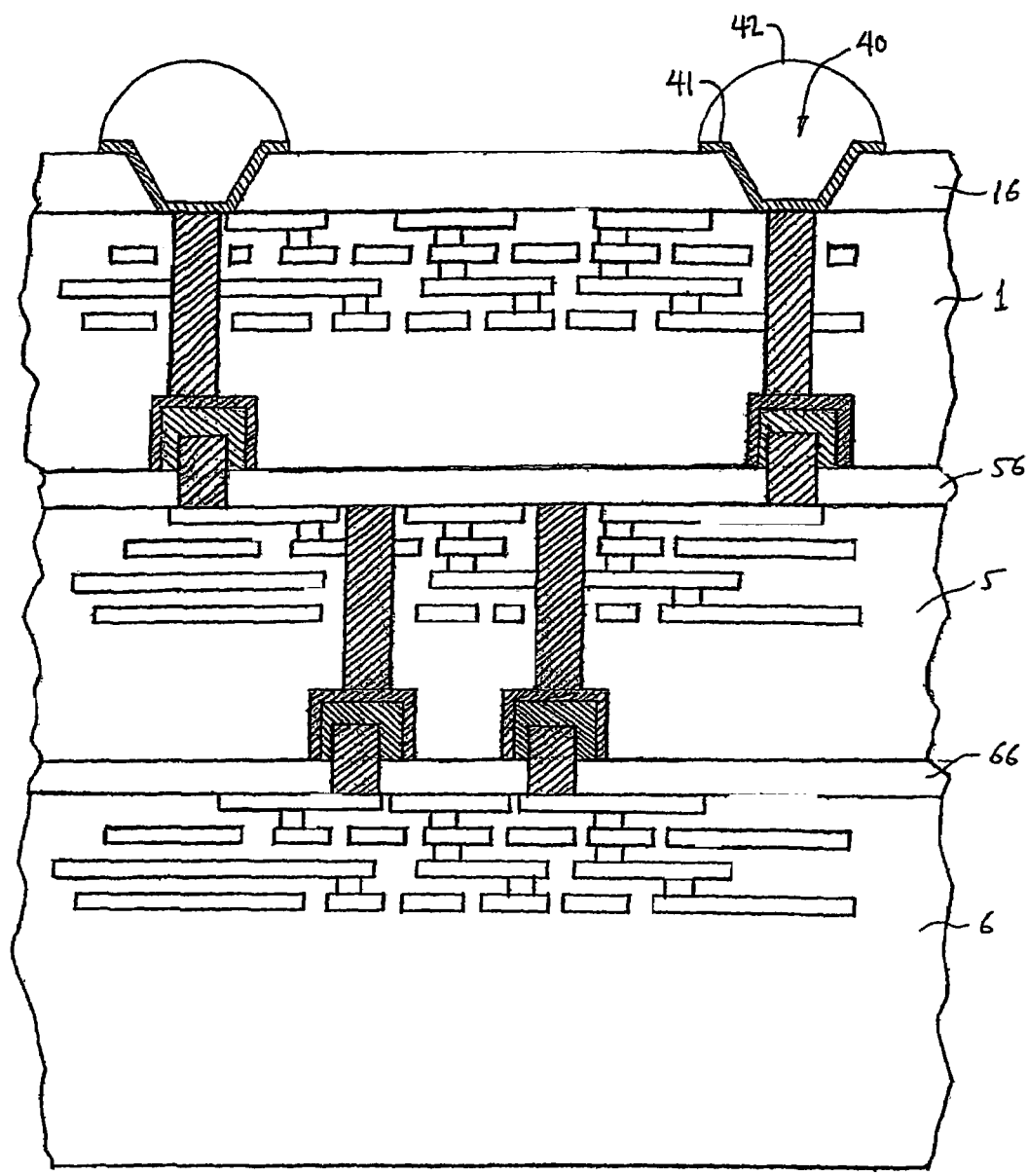

A third wafer 6, having lateral interconnect wiring 61, is prepared as shown in FIG. 2C. This wafer (similar to wafer 3 as shown in FIG. 1G) has a polyimide layer 66 on its front surface and studs 67, with alloy material 68 on the surfaces thereof for making vertical electrical connections to the other wafers. Studs 67 protrude from layer 66 a sufficient distance to make contact with the metal layer 54 on wafer 5 (that is, about 5 μm). Wafers 5 and 6 are then bonded and laminated together, as shown in FIG. 2D. Since wafer 6 is not thinned, handling plate 55 is not required after the bonding process and is therefore removed. At this point layer 56, on the front surface 5a of wafer 5, is reduced in thickness so as to expose about 5 μm in height of studs 57. Studs 57 are then ready for bonding to metal layer 14 of wafer 1. The result of this bonding process, wherein stacked wafers 5 and 6 are joined to wafer 1, is shown in FIG. 2E; alloy material 58 fills the opening 13 in thinned wafer 1, making electrical contact with metal layer 14 and thence to via 12. After wafers 5 and 6 are bonded to wafer 1, handling plate 15 is no longer required and may be removed, thereby exposing layer 16. Layer 16 may then have openings 40 formed therein and metal pads 41 and C4 solder bumps 42 formed to connect to vias 12 (FIG. 2F; compare FIG. 1I).

It will be appreciated that the above-described techniques for stacking a plurality of thinned chips, and incorporating vertical interconnects from chip to chip, greatly increases chip content and function without increasing its areal (two-dimensional) size. These processes are particularly attractive for chips having the same content, since each of the thinned and stacked chips will then have the same size. This in turn makes the overall processing for the device significantly simpler and more economical. It should be noted that these processes permit wafer-level chip-to-chip interconnection, thus making the process of creating 3-D chips significantly less expensive when compared to single-chip vertical placement, bonding and interconnection processes. In contrast to previously described vertical interconnection schemes, the chip-to-chip interconnections in the present invention are not made along the sides of the chip, but are formed directly through the chip.

It is noteworthy that with the reduced thickness of the stacked wafer (about 10 μm), the interconnection length between chips (e.g. between cache memory units) is much smaller than in a 2-D arrangement of such chips. This gives the added benefit of improved device performance, besides the savings of two-dimensional space.

Figure 3:
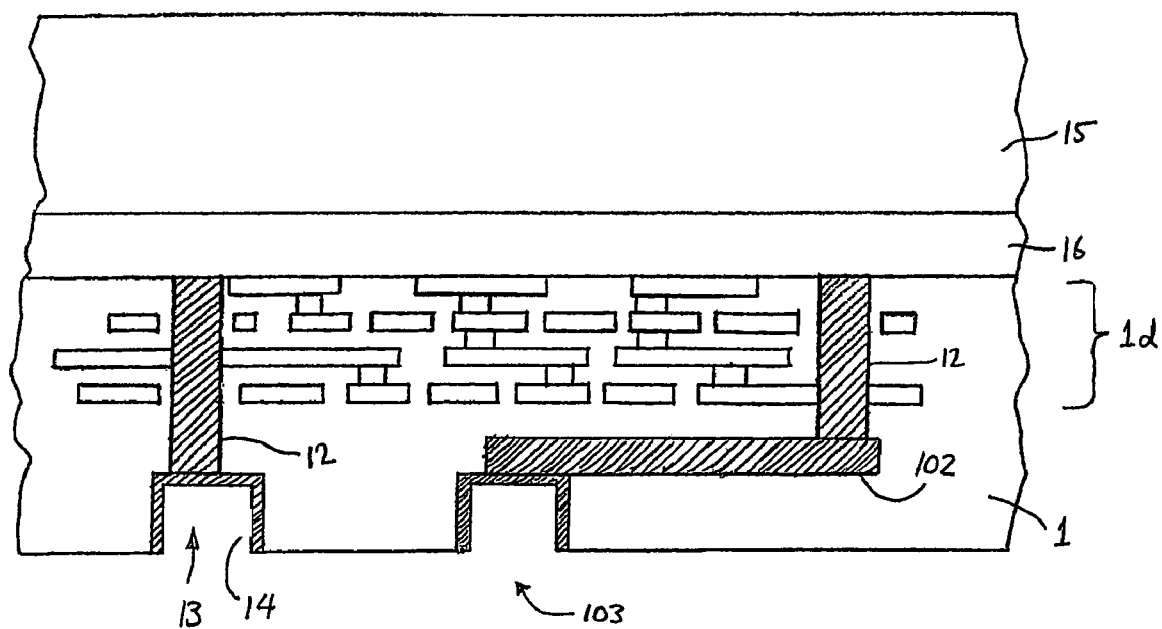
FIG. 3 illustrates a vertical interconnect between wafers extending laterally under a device region of the wafer, in accordance with the invention.

In FIGS. 1A-1I and 2A-2F, the vias are shown extending straight downward through the wafers and with a uniform diameter, for convenience of illustration. It is not necessary for the vertical chip-to-chip interconnects to have a small diameter through the full thickness of the wafer, or even for the entire 10 μm thickness of the thinned wafer. For example, as shown in FIG. 3, wafer 1 may be prepared with a large metal region 102 embedded therein. The vertical interconnect may then include a vertical wire 12 with a small diameter (less than 1 µm) to save space as it extends through the device area 1d of the wafer, and a much larger metal region 102 extending laterally underneath the device area and connecting with the metallized interior surface of backside opening 103. Opening 103 is thus separated laterally from via 12 in accordance with the lateral extent of region 102. This arrangement minimizes the space needed for the vertical interconnect in the device area while at the same time reducing the resistance of the interconnect. In addition, it should be noted that this arrangement makes it possible to locate interconnect areas directly underneath device areas on the wafer (for example, interconnection to another wafer through opening 103 located directly underneath devices in region 1d). This in turn permits flexibility in the size and location of openings 103, and thus further relaxes the need for precise alignment between wafers (in this example, between wafers 1 and 2).

Figure 4A:
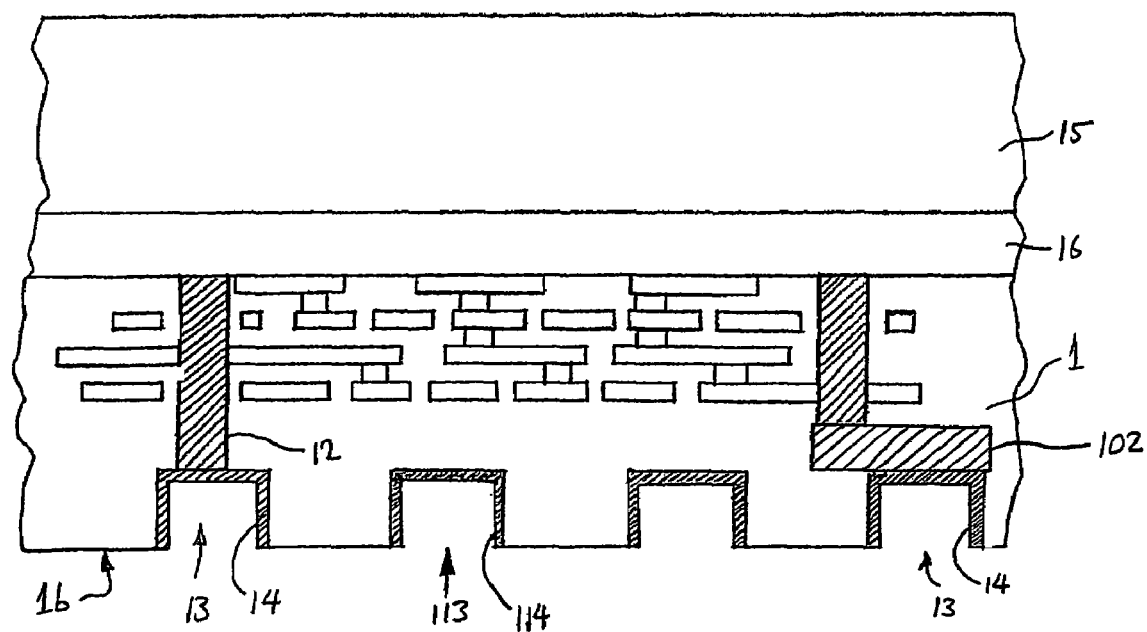
FIGS. 4A-4C illustrate a fabrication process for improving heat conduction in a 3-D integrated device, also in accordance with the invention.
Figure 4B:
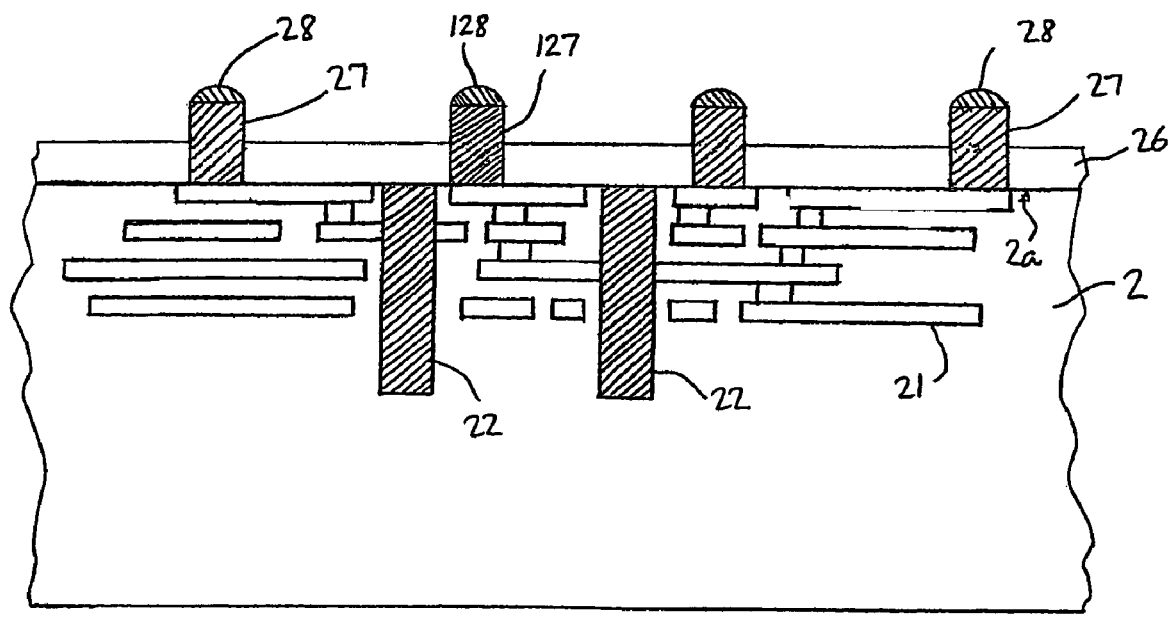
Figure 4C:
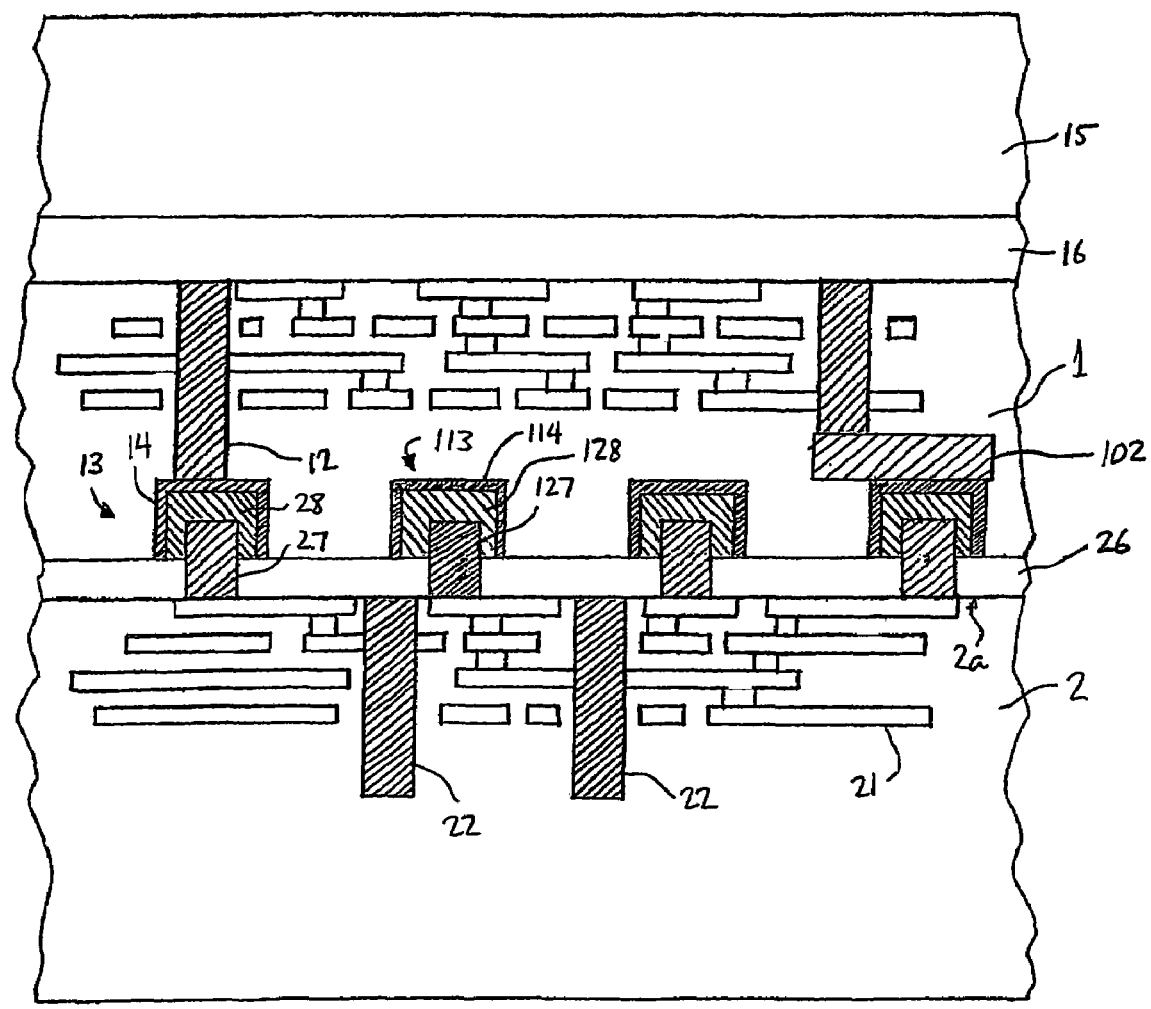

The metallized vertical connections between wafers may be used for heat conduction as well as for electrical signals. For example, as shown in FIG. 4A, an electrical pathway is routed laterally under the device region of wafer 1 to provide additional space between electrical connection openings 13 on the back side 1b of the wafer. Additional openings 113 are formed in the wafer surface and have their interior surfaces 114 coated with metal, similar to openings 13 and metallization 14. (Openings 13, 113 may be formed in the same process step; similarly for metallization 14, 114.) The additional openings 113 do not form part of an electrical connection, but serve to provide a pathway for heat conduction through the wafer stack. Additional studs 127, capped with low melting point alloy material 128, are formed on the front surface 2a of wafer 2, as shown in FIG. 4B. When the wafers are bonded together in the above-described processes, studs 127 connect with the metal 114 in openings 113, to form a metallized heat conduction pathway between wafers 1 and 2 (see FIG. 4C). As shown in FIG. 4C, studs 127 may or may not connect electrically with vias 22 or studs 27; no electrical signal is carried to the front surface of wafer 1.

Although the heat conduction pathway in FIGS. 4A-4C is shown as being formed between wafers 1 and 2, it will be appreciated that this technique may be used to improve heat conduction between any of the wafers in the stack in either of the above-described integration processes (between wafers 2 and 3 shown in FIG. 1H; between wafers 5 and 6 shown in FIG. 2D; and so forth).

Figure 5:
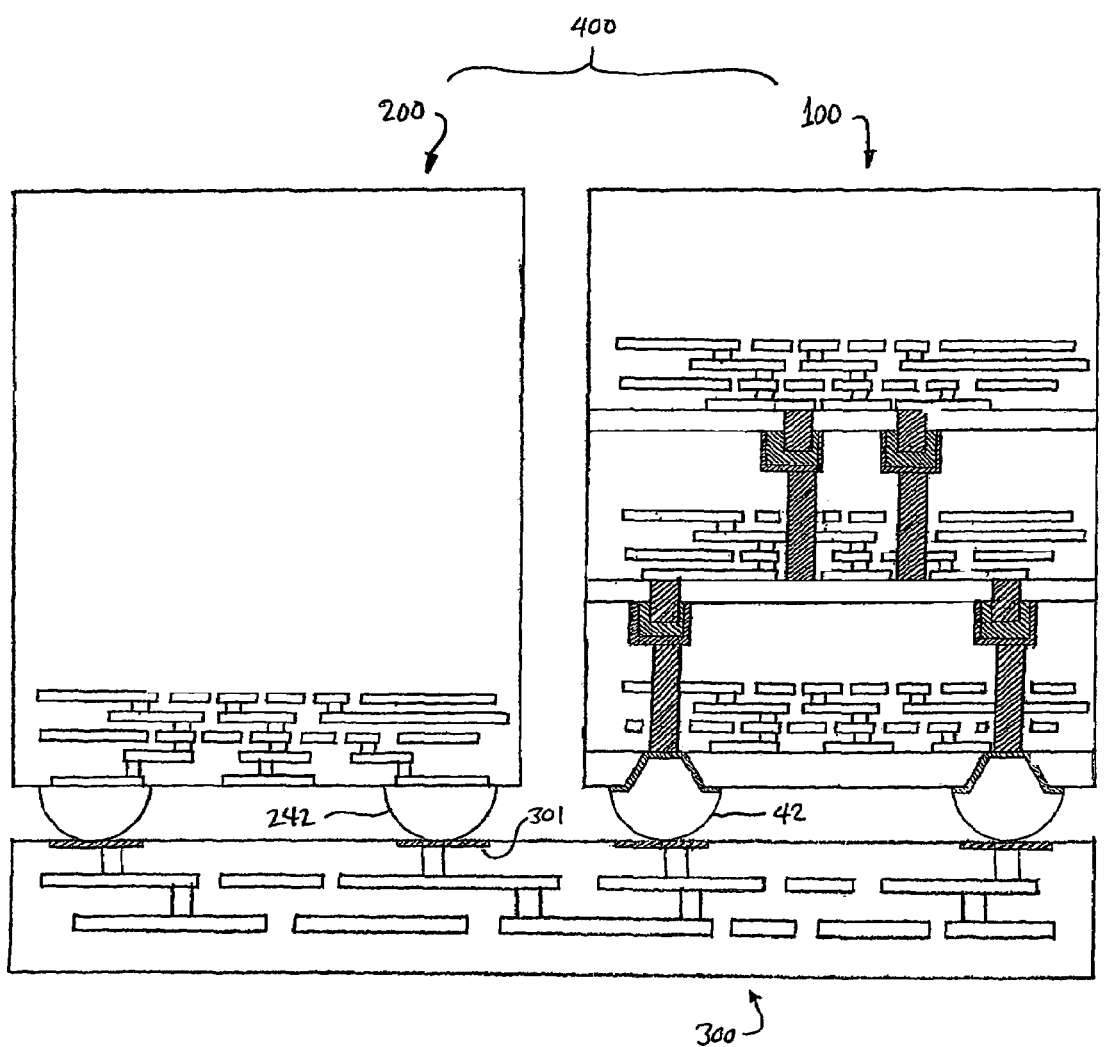
FIG. 5 illustrates a completed microprocessor device including a logic unit and a 3-D stacked memory unit, the memory unit being fabricated in accordance with the invention, where the logic and memory units are connected in a 2-D interconnection scheme using C4 technology on a multichip module (MCM).

FIG. 5 illustrates a device 400 having a vertically integrated stack (e.g. a cache memory unit) 100 which is laterally connected to a chip (e.g. a logic unit) 200, using C4 connections to a multichip module (MCM) 300. The vertical memory stack and logic chip have C4 solder bumps 42 and 242 respectively which are bonded to C4 pads 301 on the MCM. The MCM 300 may then be integrated into a larger and more complex device.

Figure 6:
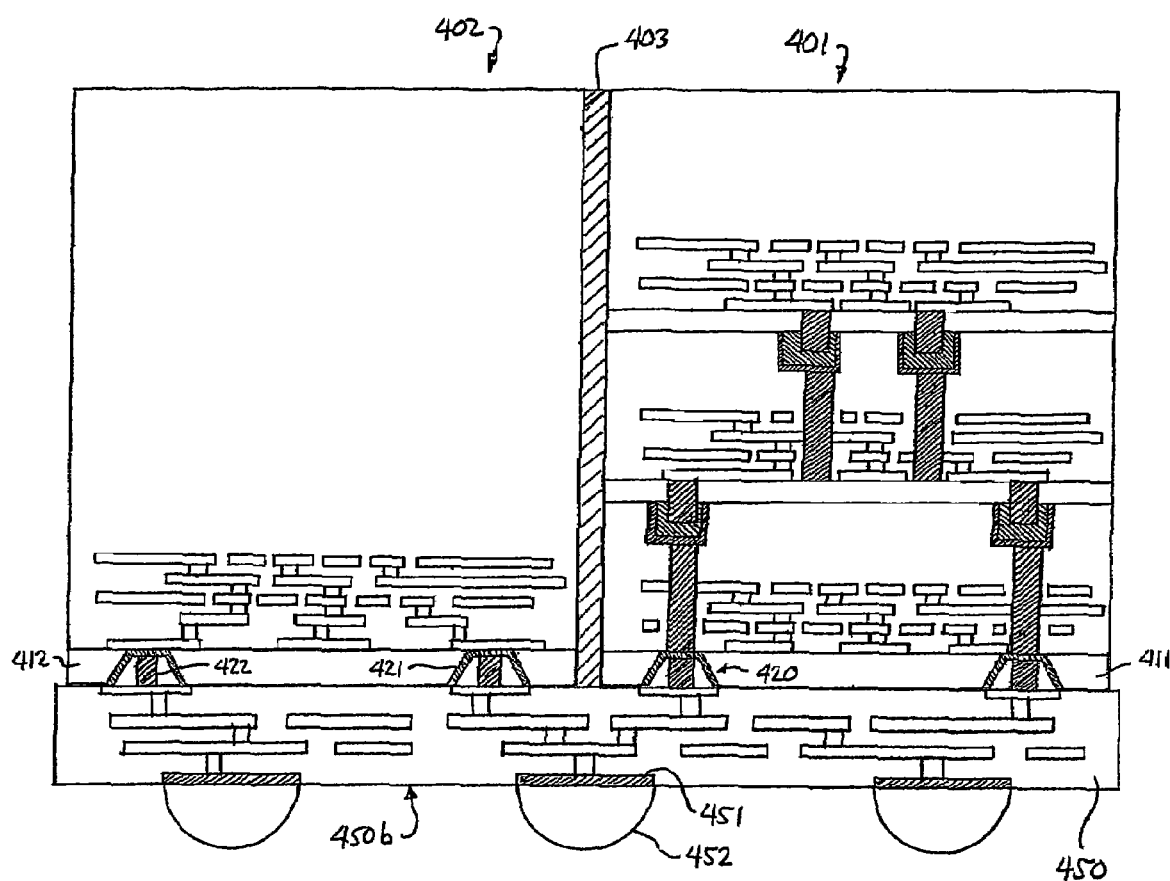
FIG. 6 illustrates a completed microprocessor device including a logic unit and a 3-D stacked memory unit, the memory unit being fabricated in accordance with the invention, where the logic and memory units are connected in a 2-D transfer and join (T&J) interconnection scheme using stud/via connections.

A closer connection between the cache memory and logic units may be realized by using stud/via connections, as shown in FIG. 6. The cache memory unit 401 is prepared according to one of the processes described above, but with metallized vias 420 in polyimide layer 411 (compare FIGS. 1I and 2F). Similar vias are formed in polyimide layer 412 on logic unit 402. An insulating layer 450 (of a low-k dielectric material, an oxide, or polyimide), having interconnect wiring embedded therein, has studs 422 formed thereon to match the locations of the vias. Layer 450 may be built up on a handling plate (not shown), with units 401 and 402 then brought into alignment with the studs 422; after a bonding process in which studs 422 are connected with metal pads 421 in the vias, the handling plate is removed from surface 450b. The gap 403 between units 401 and 402 may be filled with a suitable material (e.g. polyimide) for increased mechanical stability. The combined device (now including memory unit 401, logic unit 402, and interconnect layer 450) may then have C4 pads 451 and C4 solder bumps 452 formed on surface 450b, to create an external connection for the device.

Figure 7:
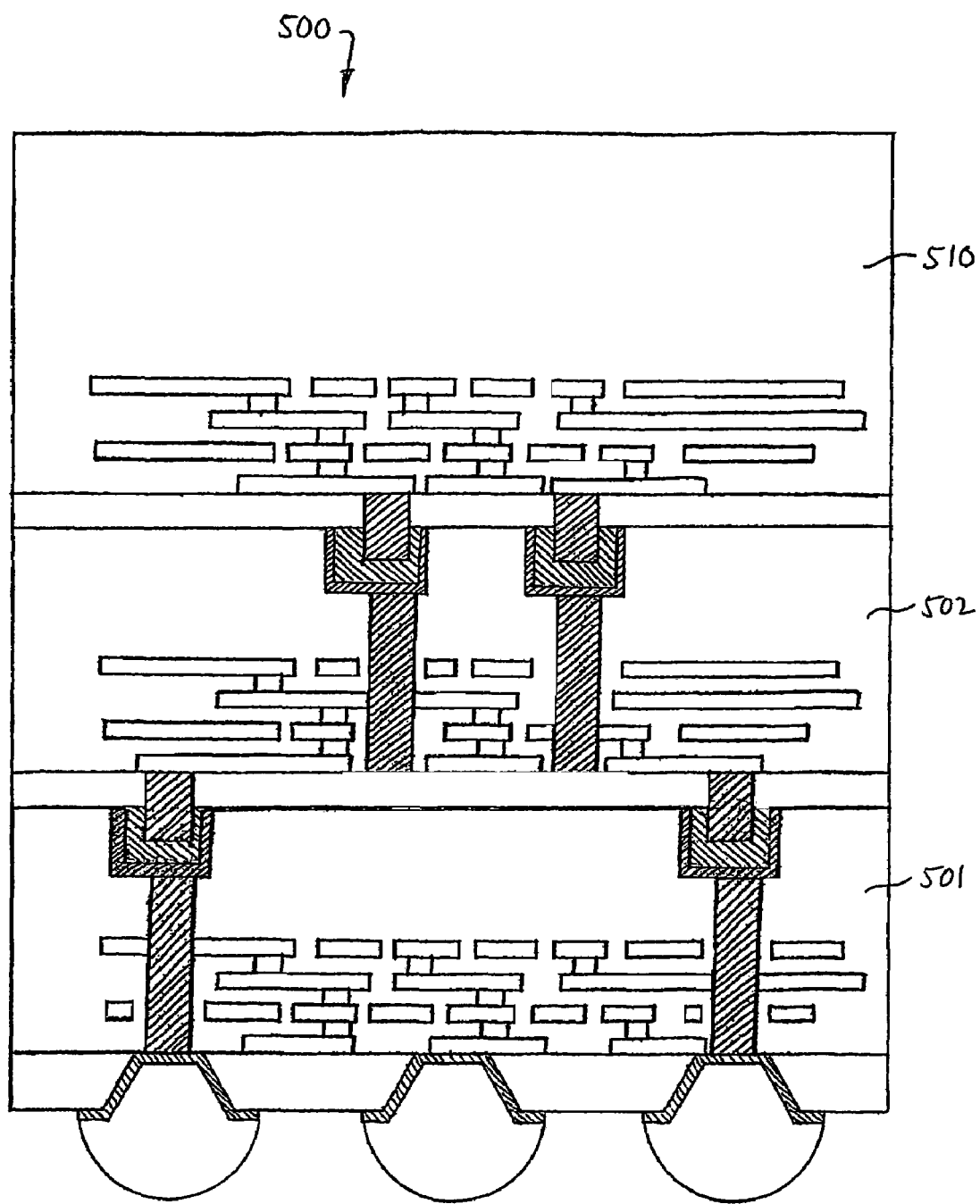
FIG. 7 illustrates a completed microprocessor device including a logic unit and memory units, where all the units are vertically integrated in accordance with the invention

Alternatively, in a device incorporating cache memory and a logic unit, both may be integrated in a vertical stack, as shown in FIG. 7. Combined device 500 includes a logic unit 510 integrated with cache memory chips 501 and 502. In this arrangement, logic unit 510 is at the top of the stack, where it is easiest to remove excess heat.

It will be understood that units 100, 200, 401, 402, 500 in FIGS. 5-7 need not be merely logic and/or memory devices, but may in fact be any of a wide variety of devices. Accordingly, different device technologies may easily be combined in a 3-D integrated device using the process of the present invention.

The present invention is generally applicable to semiconductor device structures where high areal density of devices is required. The invention is particularly applicable to chips requiring large memory cache contents which cannot be fabricated with presently available methods due to reticle size limitations or due to limited process yields.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

The invention claimed is:

1. A method for fabricating a three-dimensional integrated device including a plurality of vertically stacked and interconnected wafers, the method comprising the steps of:
   providing a first wafer having a front surface and a back surface, the first wafer having devices formed in a region adjacent to the front surface thereof;
   forming a via in the first wafer extending from the front surface, the via being characterized by a lateral dimension at the front surface;
   removing material from the first wafer at the back surface thereof;
   forming an opening in the back surface of the first wafer, thereby exposing the via, the opening having a lateral dimension grater than said lateral dimension of the via;
   forming a layer of conducting material in said opening;
   providing a second wafer having a front surface and a back surface, the second wafer having devices formed therein adjacent to the front surface thereof;
   forming a stud on the front surface of the second wafer;
   forming a layer of bonding material on the front surface of the second wafer, the studs projecting vertically therefrom;
   aligning the stud to the opening in the back surface of the first wafer; and
   bonding the second wafer to the first wafer using the layer of bonding material, so that the stud makes electrical contact with the via, further comprising the steps of:
   forming a via in the second wafer extending from the front surface thereof, the via being characterized by a lateral dimension at the front surface;
   removing material from the second wafer at the back surface thereof;

forming an opening in the back surface of the second wafer, thereby exposing the via therein, said opening having a lateral dimension greater than said lateral dimension of the via;

forming a layer of conducting material in said opening;

providing a third wafer having a front surface, the third wafer having devices formed therein adjacent to the front surface thereof;

forming a stud on the front surface of the third wafer;

forming a layer of bonding material on the front surface of the third wafer, the studs projecting vertically therefrom;

aligning the stud to the opening in the back surface of the second wafer; and bonding the third wafer to the second wafer using the layer of bonding material, so that the stud of the third wafer makes electrical contact with the via of the second wafer, with the stud of the second wafer, and with the via of the first wafer.

2. A method according to 1, wherein said step of removing material causes the wafer to have a thickness of less than 20 µm.

3. A method according to claim 1, further comprising the step of attaching a handling plate to the front surface of the first wafer using a layer of bonding material.

4. A method according to claim 1, further comprising the step of forming a conducting body in one of the first wafer and the second wafer and connecting to the via in the first wafer, the conducting body extending laterally under the devices of the first wafer, and wherein the opening in the back side of the first wafer is separated laterally from the via in accordance with the lateral extent of the conducting body.

5. A method according to claim 1, further comprising the steps of:

forming an additional opening in the back surface of the first wafer;

forming an additional layer of conducting material in said additional opening;

forming an additional stud on the front surface of the second wafer; and aligning the additional stud to the additional opening in the back surface of the first wafer; and wherein said step of bonding the second wafer to the first wafer forms a connection between the additional stud and the additional layer of conducting material for conducting heat between the second wafer and the first wafer.

6. A method according to claim 5, wherein the additional layer of conducting material is electrically insulated from the via.

7. A method according to claim 1, further comprising the steps of:

forming an additional opening in the back surface of the second wafer;

forming an additional layer of conducting material in said additional opening;

forming an additional stud on the front surface of the third wafer; and aligning the additional stud to the additional opening in the back surface of the second wafer;

and wherein said step of bonding the third wafer to the second wafer forms a connection between the additional stud and the additional layer of conducting material for conducting heat between the third wafer and the second wafer.

8. A method according to claim 1, wherein said bonding material is a thermoplastic material.

9. A method according to claim 8, wherein the thermoplastic material is polyimide.

10. A method according to claim 1, further comprising the step of attaching the three-dimensional integrated device to a multichip module.

11. A method according to claim 1, further comprising the step of attaching the three-dimensional integrated device to an insulating layer having wiring formed therein using a stud-via connection.

12. A method according to claim 1, wherein the first wafer and second wafer have cache memory devices, and the third wafer has logic devices.

13. A method according to claim 1, wherein at least one of the first wafer, the second wafer and the third wafer includes a MEMS device.

* * * * *